(12) United States Patent
Burt et al.

(10) Patent No.: US 8,072,262 B1
(45) Date of Patent: Dec. 6, 2011

(54) LOW INPUT BIAS CURRENT CHOPPING SWITCH CIRCUIT AND METHOD

(75) Inventors: Rodney T. Burt, Tucson, AZ (US); Joy Y. Zhang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/803,468

(22) Filed: Jun. 28, 2010

(51) Int. Cl.
*H03F 1/02* (2006.01)

(52) U.S. Cl. ............... 330/9; 330/69; 330/310; 330/98; 327/124; 327/307

(58) Field of Classification Search ............... 330/9, 69, 330/310, 98, 150; 327/124, 307
See application file for complete search history.

(56) References Cited

U.S. PATENT DOCUMENTS

| | | | | |
|---|---|---|---|---|
| 5,148,167 A | * | 9/1992 | Ribner | 341/143 |
| 5,477,481 A | * | 12/1995 | Kerth | 708/819 |
| 6,201,835 B1 | * | 3/2001 | Wang | 375/247 |
| 6,262,626 B1 | | 7/2001 | Bakker et al. | 330/9 |
| 6,351,506 B1 | | 2/2002 | Lewicki | |
| 6,639,532 B1 | * | 10/2003 | Liu et al. | 341/143 |
| 6,842,486 B2 | * | 1/2005 | Plisch et al. | 375/247 |
| 7,233,198 B2 | | 6/2007 | Niederkorn | |
| 7,292,095 B2 | | 11/2007 | Burt et al. | 330/9 |
| 7,538,705 B2 | * | 5/2009 | Deval et al. | 341/143 |

OTHER PUBLICATIONS

"A Micropower Chopper-Stabilized Operational Amplifier Using a SC Notch Filter With Synchronous Integration Inside the Continuous-Time Signal Path" by Rod Burt and Joy Zhang, IEEE Journal of Solid-State Circuits, vol. 41, No. 12, Dec. 2006, pp. 2729-2736.

* cited by examiner

*Primary Examiner* — Patricia Nguyen
(74) *Attorney, Agent, or Firm* — John J. Patti; Wade J. Brady, III; Fredrick J. Telecky, Jr.

(57) ABSTRACT

A chopper-stabilized circuit (1) includes pre-chopping circuitry (26) for chopping an input signal (Vin) at a first frequency to generate a first signal. Input chopping circuitry (9) chops the first signal at a second frequency substantially greater than the first frequency to produce a second signal. The first frequency is a sub-harmonic of the second frequency. Post-chopping circuitry (30) chops the second chopped signal at the first frequency to produce a third signal that is applied to an input of a signal conditioning circuit (2). The output chopping circuitry (10) chops an output of the signal conditioning circuit at the second frequency to generate a fourth signal. The fourth signal is filtered.

20 Claims, 4 Drawing Sheets

LOW INPUT BIAS CURRENT CHOPPING SWITCH CIRCUIT AND METHOD

BACKGROUND OF THE INVENTION

The present invention relates generally to chopper-stabilized operational amplifiers. The invention also relates to chopper-stabilized operational amplifiers which include notch filters to reduce output ripple voltage due to the chopping signals. The invention relates more particularly to improvements which substantially reduce input bias current without necessarily decreasing chopping clock voltage level levels, without causing increased chopping-clock-induced ripple voltages, and/or without the need to increase notch filter capacitor size.

Chopper-stabilized operational amplifiers used as stand alone operational amplifiers provide excellent offset voltage and offset voltage drift performance without the need for trimming of components to reduce offset and drift. This means that in addition to good DC performance, chopper-stabilized operational amplifiers also have advantages of reduced integrated circuit die size and lower product cost. However, a major drawback of the known prior art chopper stabilization circuitry is the associated increased input bias current. (The term "input bias current" (not to be confused with the term "quiescent supply current") refers only to the current required to flow into the signal path of the input terminals 7A and 7B, and it relates to matters such as generated noise and DC errors that react with the input source impedance. The input bias current is directly proportional to chopping clock frequency and also is dependent on the chopping clock voltage level and chopping switch types and sizes. Input bias current also is very dependent on integrated circuit layout and parasitics.)

The input bias current of a chopper-stabilized CMOS operational amplifier is significantly larger than that of a standard CMOS operational amplifier because of charge injection and clock feed-through induced from the input chopping switches.

It should be understood that the above mentioned charge injection occurs at the input chopping switches of a chopper-stabilized amplifier and results in a DC current component i.e., a DC offset, of the chopper-stabilized amplifier. An input chopping stage is coupled to two input terminals to which a differential input signal is applied, and that results in an injected charge flowing into or out of each of the two input terminals, respectively, at a rate proportional to the chopping frequency. Any mismatches in the chopping switches and/or associated parasitic elements cause a difference between the amount of injected charge that flows into and out of the two input terminals, respectively. If that difference in the injected charge is integrated over time, e.g., over any chopping period, a net amount of injected charge flows into or out of the two input terminals over any chopping cycle, and by definition, is a DC current or DC offset. Thus, relatively small spikes of current may be flowing into and out of each of the positive and negative input terminals, respectively of the chopper-stabilized amplifier. For example, if a positive current spike and the corresponding negative current spike are not precisely matched, there is a recurring "net current spike" that is integrated over time. That results in the above mentioned input bias current, which is a DC current. In this example, if a net current of 100 picoamperes flows into the positive input of the chopper-stabilized amplifier due to the above mentioned mismatches, there will be 100 picoamperes flowing out of the negative input (because of conservation of charge principles).

While the lowest possible chopping clock voltage level and smallest possible chopping switch size should always be used to minimize charge injection and clock feed-through, there is not much design flexibility for adjusting these two variables in order to meet certain design specifications, such as noise, speed, and signal level. Also, even though good integrated circuit layout practice should always be used to minimize parasitics, there is always random variation that contributes significantly to a distribution of the input bias current. Lowering the chopping frequency reduces input bias current, but leads to the need for larger filter capacitors to maintain a similar level of chopping ripple (i.e., chopping-clock-induced ripple or "ripple noise") at the amplifier output.

It is highly desirable that integrated circuit operational amplifiers have low offset voltage, low noise, low offset drift, and good signal stability. Chopper stabilization and auto-zeroing are two common techniques that have been widely used to reduce amplifier offset voltage and drift. (For example, conventional chopper stabilization would typically reduce a 5 millivolt offset voltage to roughly 5 microvolts.) Modern chopper-stabilized operational amplifiers and auto-zero operational amplifiers have significantly reduced, or even essentially eliminated, the amount switching noise compared to previous designs. However, the improved design techniques used in modern chopper-stabilized operational amplifiers and auto-zero operational amplifiers result in trade-offs between input referred noise and quiescent supply current (Iq). The inherent trade-offs between basic chopper-stabilized amplifiers and auto-zero amplifiers are well known. While auto-zeroing methods provide low ripple noise at the amplifier output, its in-band noise is high due to aliasing or noise folding. On the other hand, chopper stabilization techniques present lower in-band noise due to absence of noise folding, but output ripple noise is relatively higher. Basic chopper-stabilized amplifiers maintain the broadband noise characteristics of their input stages but "shift" or modulate the input offset voltages up in frequency to the chopping frequency. This creates large ripple voltages at the amplifier outputs. Although basic auto-zero amplifiers do not shift their input offset to their auto-zero frequency like chopper-stabilized amplifiers, auto-zero amplifiers suffer from aliasing or folding back of their broadband noise spectrums during their zeroing cycles. This increases the overall input referred noise of auto-zero amplifiers.

It can be shown that for an ideal input stage, the square of the input referred noise is inversely proportional to the quiescent supply current Iq of the amplifier, which causes the basic auto-zero amplifiers to have significantly increased quiescent supply current Iq in order to achieve the desired noise levels, including the aliasing or noise folding. This makes it very desirable to use chopper-stabilized amplifiers in micropower applications and to find a way of solving the basic problem of ripple noise at the chopping frequency.

The closest prior art to the present invention is believed to include commonly owned U.S. Pat. No. 7,292,095 entitled "Notch Filter for Ripple Reduction in Chopper Stabilized Amplifiers" issued Nov. 6, 2007 to the present inventors, and incorporated herein by reference. Also see the related article by the present inventors entitled "A Micropower Chopper-Stabilized Operational Amplifier Using a SC Notch Filter with Synchronous Integration inside the Continuous-Time Signal Path", IEEE Journal of Solid-State Circuits, Vol. 41, No. 12, December 2006. The closest prior art also is believed to include U.S. Pat. No. 6,262,626 entitled "Circuit Comprising Means for Reducing the DC-Offset and the Noise Produced by an Amplifier" issued Jul. 17, 2001 to Bakker et al.

Prior Art FIG. 1 herein is the same as FIG. 3A of the above mentioned '095 patent. In Prior Art FIG. 1, chopper stabilized amplifier 1C receives an input signal Vin and includes a first operational transconductance (i.e., with a voltage input and a current output) amplifier 2 having an input chopper 9 and an output chopper 10 for chopping an output signal produced by the first operational transconductance amplifier. A switched capacitor notch filter 15 filters the chopped output signal by operating synchronously with the chopping frequency of the output chopper stage to filter ripple voltages that otherwise would be produced by the output chopper stage. A second operational transconductance amplifier 3 amplifies the notch filter output. The input signal Vin is fed forward, summed with the output of the second operational transconductance amplifier 3, and applied to the input of a third operational transconductance amplifier or operational amplifier 4. Ripple noise and offset are substantially reduced.

Unfortunately, the chopper-stabilized amplifier in Prior Art FIG. 1 generates residual error on its inputs 7A and 7B due to charge injection from the chopping signal, and this results in an increase in input bias current. That is, averaging of the mismatches of chopper switch charge injection due to minute (e.g., roughly $10^{-13}$ farad) parasitic capacitances generates a DC bias current component that flows into one side of the chopping switches and out of the other side. Although decreasing the chopping clock frequency reduces the input bias current, it also results in increased ripple voltage or requires an unacceptable increase in the size of the notch filter capacitors. (Note that this would also be true for a continuous-time filter; that is, decreasing the chopping clock frequency would result in increased ripple voltage or would require an unacceptable increase in capacitances in the continuous-time filter.)

Prior Art FIG. 2 herein discloses an amplifier AMP as shown in FIG. 2 of the above mentioned '626 patent. Amplifier AMP in Prior Art FIG. 2 includes a pair of chopping switch circuits or "choppers" $CHP_i$ and $CHP_o$ for reducing the DC offset and the noise produced by amplifier AMP. To obtain optimal noise reduction, choppers $CHP_i$ and $CHP_o$ operate at a high frequency. As a result, the DC offset cancellation is not optimal because charge injection of the switches in choppers $CHP_i$ and $CHP_o$ produces a DC offset. To overcome this problem, amplifier AMP is provided with additional offset cancellation circuitry formed, for example, by another pair of choppers $CHP_{fi}$ and $CHP_{fo}$. Choppers $CHP_{fi}$ and $CHP_{fo}$ operate synchronously with choppers $CHP_{fi}$ and $CHP_{fo}$ but at a relatively low frequency. The combination of choppers $CHP_i$ and $CHP_o$ and additional choppers $CHP_{fi}$ and $CHP_{fo}$ ensures optimal DC offset cancellation. However, this technique, referred to as "nested chopping", increases parasitics on the output affecting input offset voltage performance. Nevertheless, this results in better trade-offs between the ripple voltage sent to the next stage if chopping frequency is increased on choppers $CHP_i$ and $CHP_o$ and the lower residual offset voltage due to charge injection in the chopping switches that occurs if the chopping frequency is decreased on $CHP_{fi}$ and $CHP_{fo}$.

There is an unmet need for a chopper-stabilized amplifier which has extremely low output ripple noise and which also has low input bias current.

SUMMARY OF THE INVENTION

There is an unmet need for a chopper-stabilized amplifier which has extremely low output ripple noise and which also has low input bias current.

Briefly described, and in accordance with one embodiment, the present invention provides a chopper-stabilized circuit (1) that includes pre-chopping circuitry (26) for chopping an input signal (Vin) at a first frequency to generate a first chopped signal. Main chopping circuitry (9) chops the first chopped signal at a second frequency substantially greater than the first frequency to produce a second chopped signal. Post-chopping circuitry (30) chops the second chopped signal at the first frequency to produce a third chopped signal that is applied to an input of a signal conditioning circuit (2). Output chopping circuitry (10) chops an output of the signal conditioning circuit at the second frequency to generate a fourth chopped signal. In one embodiment, the fourth chopped signal is filtered. In one embodiment, the filtering is performed by means of a switched capacitor notch filter. The first frequency is a sub-harmonic of the second frequency.

In one embodiment, the invention provides a chopper-stabilized circuit (1-1) including a signal conditioning circuit (2) and pre-chopping circuitry (26) which pre-chops an input signal (Vin) at a first chopping frequency to produce a first chopped signal. First chopping circuitry (9) chops the first signal at a second chopping frequency greater than the first chopping frequency to produce a second chopped signal. Post-chopping circuitry (30) chops the second chopped signal at the first chopping frequency to produce a third chopped signal and applies the third chopped signal to an input of the signal conditioning circuit (2). Second chopping circuitry (10) is coupled to an output (13A,B) of the signal conditioning circuit (2) and chops an output signal produced by the signal conditioning circuit (2) at the second chopping frequency to generate a fourth chopped signal. In the described embodiments, the signal conditioning circuit includes a first operational transconductance amplifier (2), and the first chopping frequency is a sub-harmonic of the second chopping frequency. In one example, the first chopping frequency is $\frac{1}{16}$ of the second chopping frequency.

In one embodiment, filter circuitry (15) is coupled to filter the fourth chopped signal to generate a filtered output signal. In one embodiment, the filter circuitry (15) includes a switched capacitor notch filter (15) having an input coupled to receive the fourth chopped signal, wherein the switched capacitor notch filter (15) operates to perform an integrate and transfer function on the fourth chopped signal to filter it by operating synchronously with the chopping by the second chopping circuitry (10) to notch filter ripple voltages that otherwise would occur in the output of the second chopping circuitry (10). In one embodiment, switching of the switched capacitor notch filter (15) is 90 degrees out of phase with the chopping of the output signal produced by the first operational transconductance amplifier (2).

In one embodiment, a second operational transconductance amplifier (3) has an input coupled to an output (22A, 22B) of the notch filter (15). In one embodiment, a third operational transconductance amplifier (4) has an input coupled to an output (23) of the second operational transconductance amplifier (3), and a fourth operational transconductance amplifier (5) has an input coupled to receive the input signal (Vin) and an output coupled to the output (23) of the second operational transconductance amplifier (3).

In one embodiment, the input of the notch filter (15) includes first (14A) and second (14B) input terminals, and also includes first (22A) and second (22B) output terminals. The notch filter (15) includes a first path including a first switch (16A) coupled between the first input terminal (14A) and a first conductor (17), a second switch (21A) coupled between the first conductor (17) and the first output terminal (22A), a third switch (16B) coupled between the second input terminal (14B) and a second conductor (18), and a fourth switch (21C) coupled between the second conductor (18) and the second output terminal (22B). A second path includes a fifth switch (16C) coupled between the first input terminal (14A) and a third conductor (19), a sixth switch (21B) coupled between the third conductor (19) and the first output terminal (22A), a seventh switch (16D) coupled between the second input terminal (14B) and a fourth conductor (20), and an eighth switch (21D) coupled between the fourth conductor (20) and the second output terminal (22B). A first integrate and transfer capacitor (C5) is coupled between the first (17) and second (18) conductors and a second integrate and transfer capacitor (C6) coupled between the third (19) and fourth (20) conductors.

In a described embodiment, the first (16A), third (16B), sixth (21B) and eighth (21D) switches are controlled by a first clock signal (Phase3) and the second (21A), fourth (21C), fifth (16C), and seventh (16D) switches are controlled by a second clock signal (Phase4), wherein the first (Phase3) and second (Phase4) clock signals are out of phase with each other. In one embodiment, transitions of the first (Phase3) and second (Phase4) clock signals are shifted with respect to transitions of a chopping signal of the second chopping circuitry (10). In one embodiment, transitions of the first (Phase3) and second (Phase4) clock signals are shifted by 90 degrees with respect to transitions of a chopping signal of the second chopping circuitry (10).

In a described embodiment, the notch filter (15) operates synchronously with a chopping signal of the second chopping circuitry (10) to cause a charge at the input (14A,B) of the notch filter (15) to be integrated onto a first integrate and transfer capacitor (C5) during the first clock signal (Phase3) and onto the second integrate and transfer capacitor (C6) during the second clock signal (Phase4) and to cause the charge held on the first integrate and transfer capacitor (C5) to be transferred to the output (22A,B) of the notch filter (15) during the second clock signal (Phase4) and to cause the charge held on the second integrate and transfer capacitor (C6) to be transferred to the output (22A,B) of the notch filter (15) during the first clock signal (Phase3).

In one embodiment, the invention provides a method of operating a chopper-stabilized circuit (1) including a signal conditioning circuit (2) so as to reduce ripple noise without substantially increasing input bias current, the method including chopping an input signal (Vin) at a first chopping frequency to generate a first chopped signal; chopping the first chopped signal at a second chopping frequency substantially greater than the first chopping frequency to produce a second chopped signal; chopping the second chopped signal at the first chopping frequency to produce a third chopped signal and applying the third chopped signal to an input of the signal conditioning circuit (2); and chopping an output signal of the signal conditioning circuit (2) at the second chopping frequency to generate a fourth chopped signal. In one embodiment, the method includes filtering the fourth chopped signal to generate a filtered output signal.

In one embodiment, the method includes filtering the fourth chopped signal by means of a switched capacitor notch filter (15) having an input coupled to receive the fourth chopped signal (14A,B), and also includes operating the switched capacitor notch filter (15) by performing an integrate and transfer function on the fourth chopped signal synchronously with the fourth chopped signal to notch filter ripple voltages from the fourth chopped signal (14A,B).

In one embodiment, the invention provides a chopper-stabilized circuit (1) including a signal conditioning circuit (2); means (26) for chopping an input signal (Vin) at a first chopping frequency to generate a first chopped signal; means (9) for chopping the first chopped signal at a second chopping frequency substantially greater than the first chopping frequency to produce a second chopped signal; means (30) for chopping the second chopped signal at the first chopping frequency to produce a third chopped signal and applying the third chopped signal to an input of the signal conditioning circuit (2); and means (10) for chopping an output signal produced by the signal conditioning circuit (2) at the second chopping frequency to generate a fourth chopped signal.

DETAILED DESCRIPTION OF THE PREFERRED EMBODIMENTS

Figure 3A:
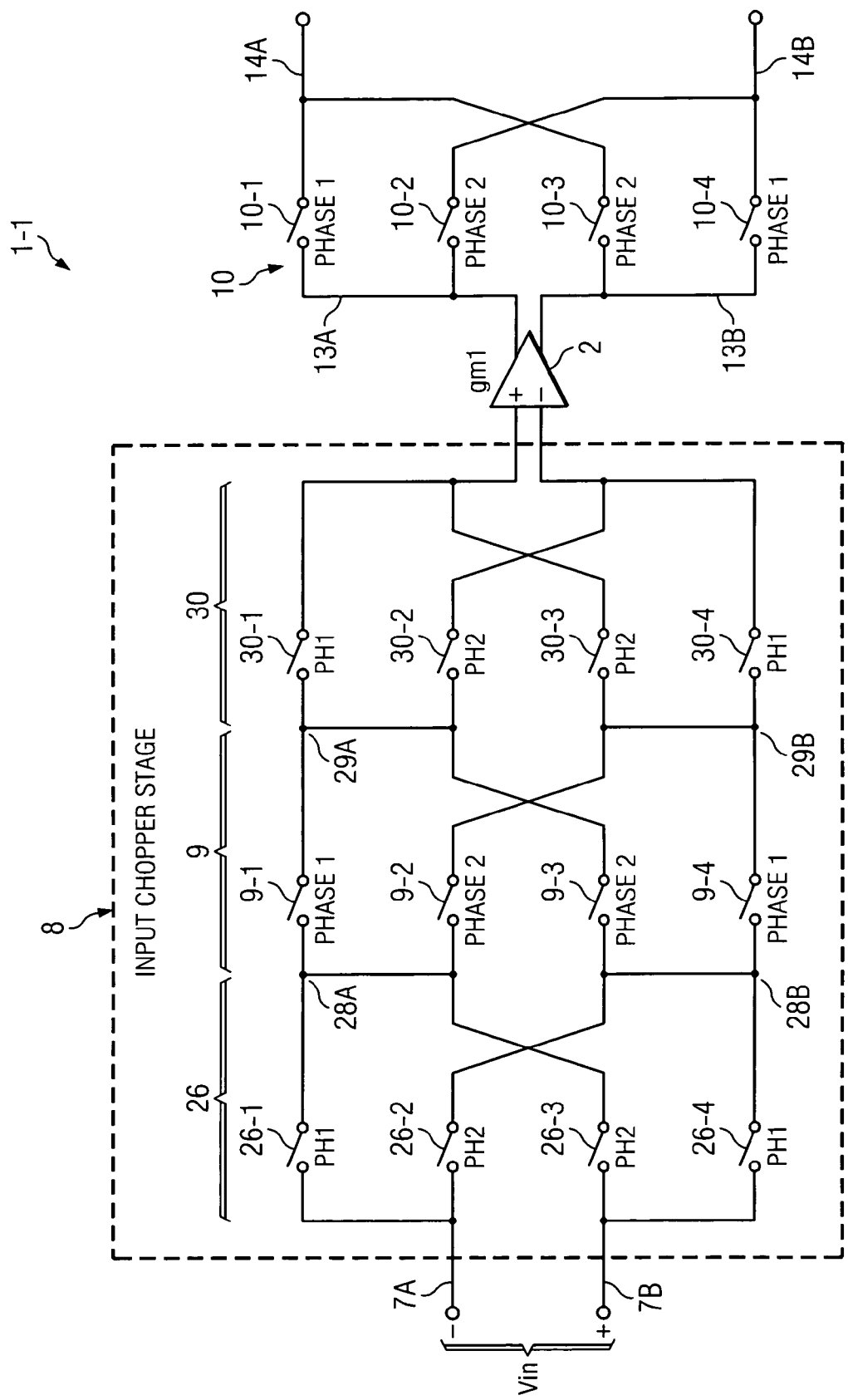
FIG. 3A is a schematic diagram of an embodiment of the present invention.

Referring to FIG. 3A, operational amplifier 1-1 includes (−) input conductor 7A and (+) input conductor 7B by means of which an input signal Vin is applied to input chopping stage 8, which includes a low-frequency pre-chopping circuit 26, a high-frequency chopping circuit 9, and a low-frequency post-chopping circuit 30. Pre-chopping circuit 26 includes switches 26-1 and 26-2 having first terminals connected to (−) input conductor 7A and switches 26-3 and 26-4 having first terminals connected to (+) input conductor 7B. Switches 26-1 and 26-3 have second terminals connected by conductor 28A to one input of input chopping circuit 9, and switches 9-2 and 9-4 have second terminals connected by conductor 28B to another input of input chopping circuit 9. Input chopping circuit 9 includes switches 9-1 and 9-2 having first terminals connected to conductor 28A and switches 9-3 and 9-4 having first terminals connected to conductor 28B. Switches 9-1 and 9-3 have second terminals connected by conductor 29A to one input of post-chopping circuit 30, and switches 9-2 and 9-4 have second terminals connected by conductor 29B to another input of post-chopping circuit 30. Post-chopping circuit 30 includes switches 30-1 and 30-2 having first terminals connected to conductor 29A and switches 30-3 and 30-4 having first terminals connected to conductor 29B. Switches 30-1 and 30-3 have second terminals connected to the (+) input of operational transconductance amplifier 2, and switches 30-2 and 30-4 have second terminals connected to the (−) input of operational transconductance amplifier 2.

It should be understood that block 2 in FIG. 3A may represent any of a variety of signal conditioning circuits that operate on the basic input signal such as a generalized amplifier, an operational transconductance amplifier, or a circuit that provides more complex signal conditioning. For example, the signal conditioning circuit may include an ADC wherein an analog input signal is digitized and the results are digitally processed. In another example, the signal conditioning circuit could include an analog voltage amplifier.

Output conductors 13A and 13B of operational transconductance amplifier 2 are connected to output chopping circuit 10, which includes switches 10-1 and 10-2 having first terminals connected to conductor 13A and switches 10-3 and 10-4 having first terminals connected to conductor 13B. Chopping switches 10-1 and 10-3 have second terminals connected to conductor 14A, and chopping switches 10-2 and 10-4 have second terminals connected to conductor 14B. The chopped output of operational transconductance amplifier 2 produced between conductors 14A and 14B is applied to the differential inputs of a switched capacitor notch filter 15.

Pre-chopping circuit 26 has the same kinds of mismatches as input chopping circuit 9. Since the input bias current at input conductors 7A and 7B is proportional to the lower chopping clock frequency of PH1 and PH2, the input bias current at input conductors 7A and 7B of chopper-stabilized amplifier 1-1 of FIG. 3A is substantially reduced compared to what it is in Prior Art FIG. 1. For example, if the pre-chopping frequency is reduced by a factor of 64 relative to the chopping frequency input chopping circuit 9, the input bias current at input terminals 7A and 7B is reduced by a factor of about 64 compared to the input bias current at input terminals 7A and 7B and Prior Art FIG. 1 (assuming perfect cancellation out of chopping switches 9). Although perfect error cancellation is not achieved in input chopping switches 9, a very substantial reduction in input bias current at terminals 7A and 7B is achieved. Pre-chopping switches 26 accomplish a first order cancellation of the errors due to chopping switches 9.

Figure 1:
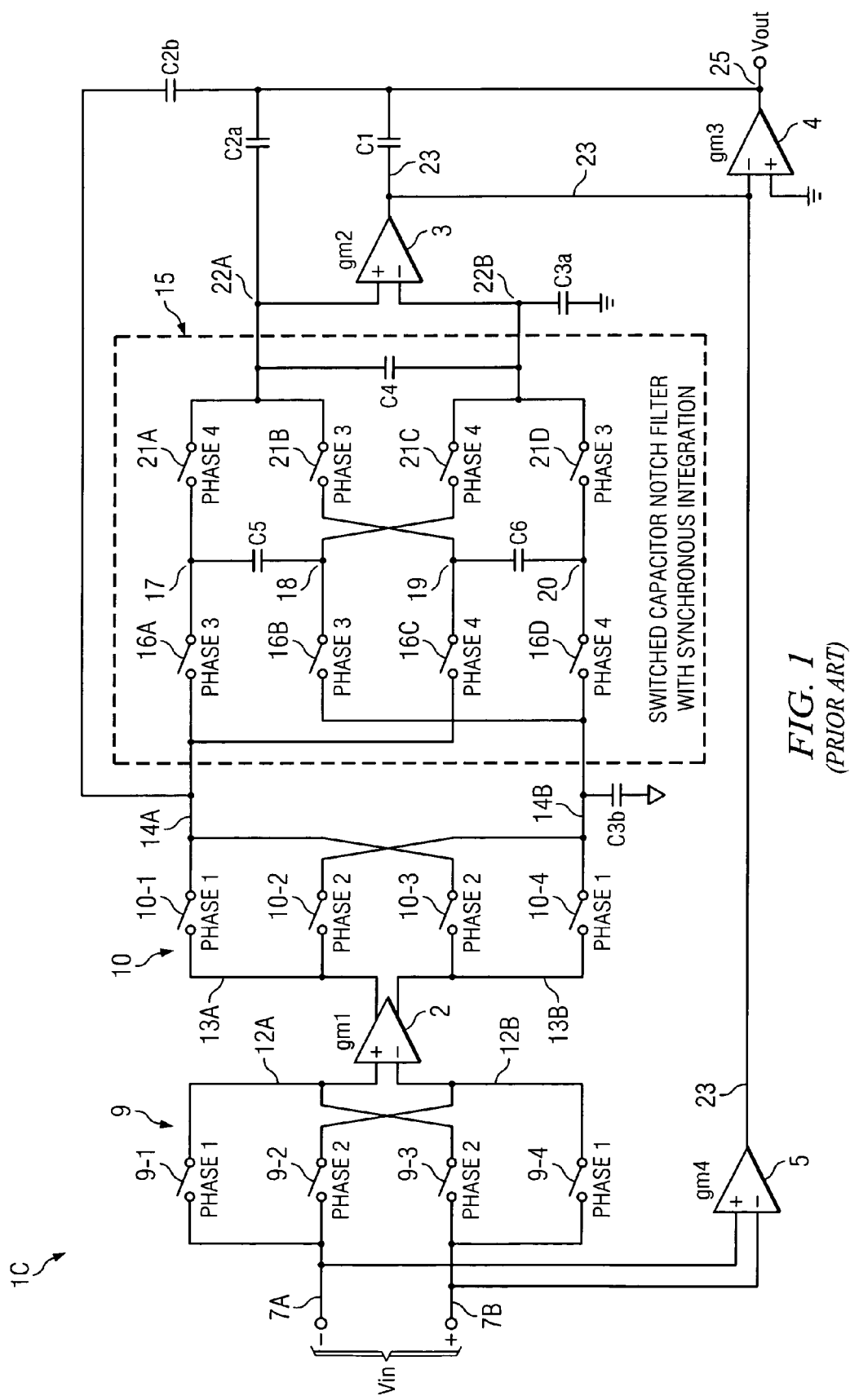
FIG. 1 is a copy of FIG. 3A of commonly owned prior art U.S. Pat. No. 7,292,095.
Figure 2:
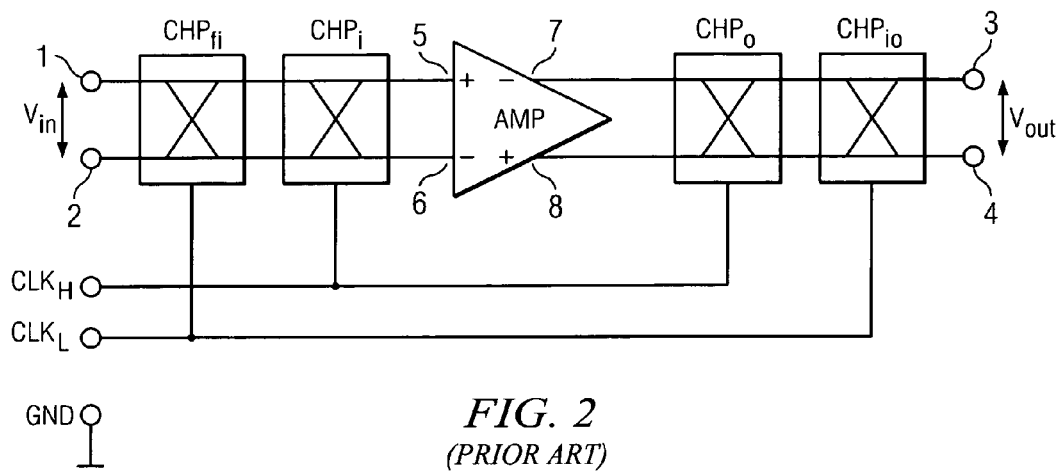
FIG. 2 is a copy of FIG. 2 of prior art U.S. Pat. No. 6,262,626.

The output of operational amplifier 1-1 of FIG. 3A can be applied to a conventional continuous-time filter, or it can be applied to a switched capacitor notch filter as shown in Prior Art FIG. 1. Furthermore, the output of operational amplifier 1-1 could be applied to a filter based on some other filtering methodology.

Figure 3B:
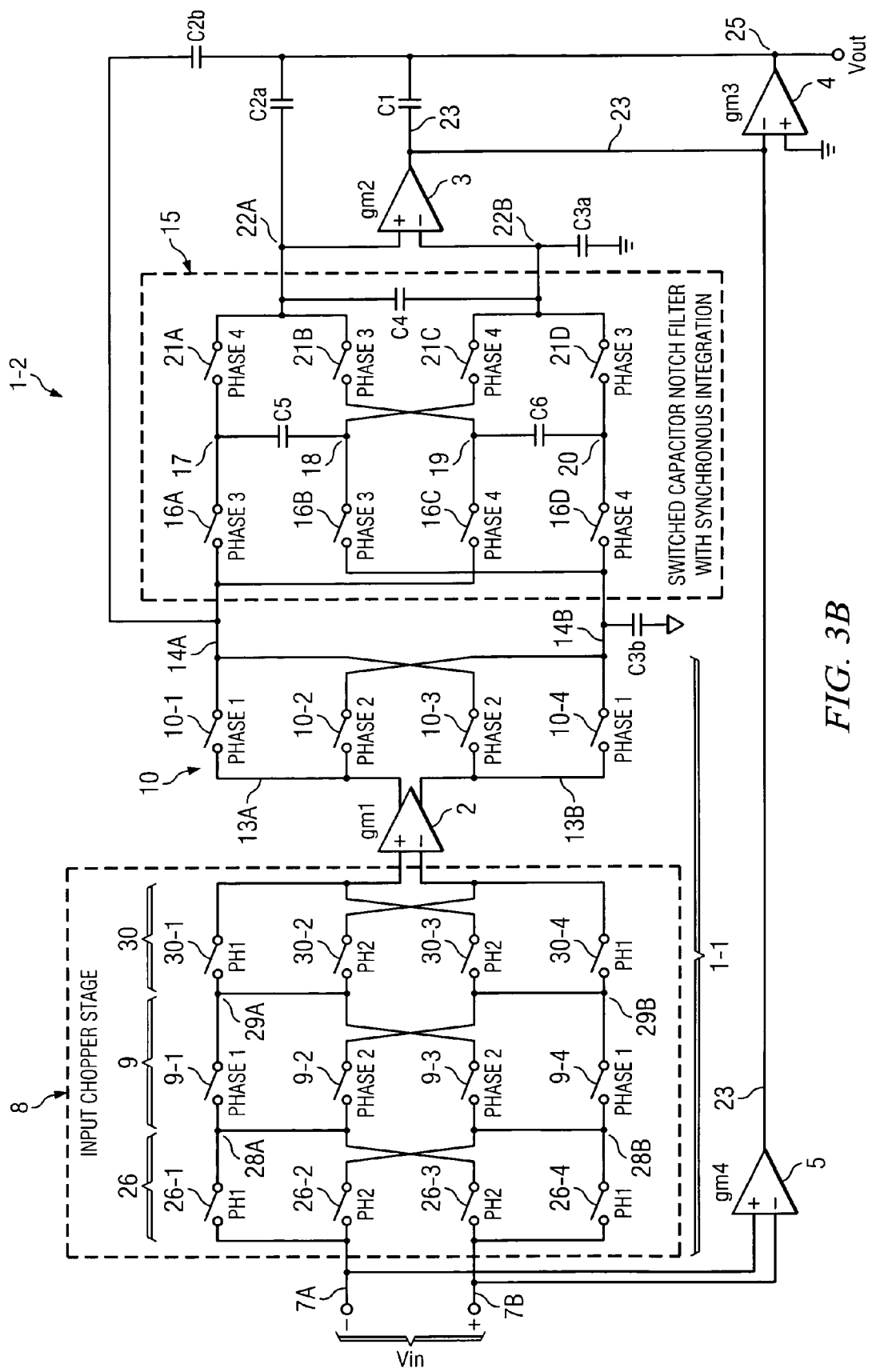
FIG. 3B is a schematic diagram of another embodiment of the present invention.

FIG. 3B shows a chopper-stabilized operational amplifier 1-2 that includes the basic chopper-stabilized operational amplifier 1-1 of FIG. 3A, with its output conductors 14A and 14B coupled to the inputs of a notch filter 15. Notch filter 15 can be the switched capacitor notch filter shown in Prior Art FIG. 1 or it can be a conventional continuous-time filter. Switched capacitor notch filter 15 (which is a low pass filter with notches at the chopping frequency fs and its harmonics) includes switch 16A connected between conductors 14A and 17, switch 16B connected between conductors 14B and 18, switch 16C connected between conductors 14A and 19, and switch 16D connected between conductors 14B and 20. Conductor 14B is also connected to one terminal of a compensation capacitor C3b, the other terminal of which is connected to ground. Conductor 14A also is connected to one terminal of a compensation capacitor C2b, the other terminal of which is connected to Vout conductor 25.

An "integrate and transfer" capacitor C5 is connected between conductors 17 and 18, and another "integrate and transfer" capacitor C6 is connected between conductors 19 and 20. Switched capacitor notch filter 15 also includes switch 21A connected between conductors 17 and 22A, switch 21B connected between conductors 19 and 22A, switch 21C connected between conductors 18 and 22B, and switch 21D connected between conductors 20 and 22B. Capacitor C4 is connected between output conductors 22A and 22B of notch filter 15. The (+) input conductor 7B of operational amplifier 1 is connected to the (−) input of operational transconductance amplifier 5, the (+) input of which is connected to the (−) input conductor 7A of operational amplifier 1. The output of a feed-forward operational transconductance amplifier 5 is connected by conductor 23 of the (−) input of operational amplifier 4, which alternatively can be a transconductance operational amplifier. (Capacitor C4 might be optional in some cases, but it has been found to provide somewhat improved charge transfer, somewhat improved filtering and ripple noise reduction, and/or somewhat improved frequency compensation.)

The transconductances of operational transconductance amplifiers 2 and 3, operational amplifier (or transconductance operational amplifier) 4, and transconductance operational amplifier 5 are gm1, gm2, gm3, and gm4, respectively.

Figure 4:
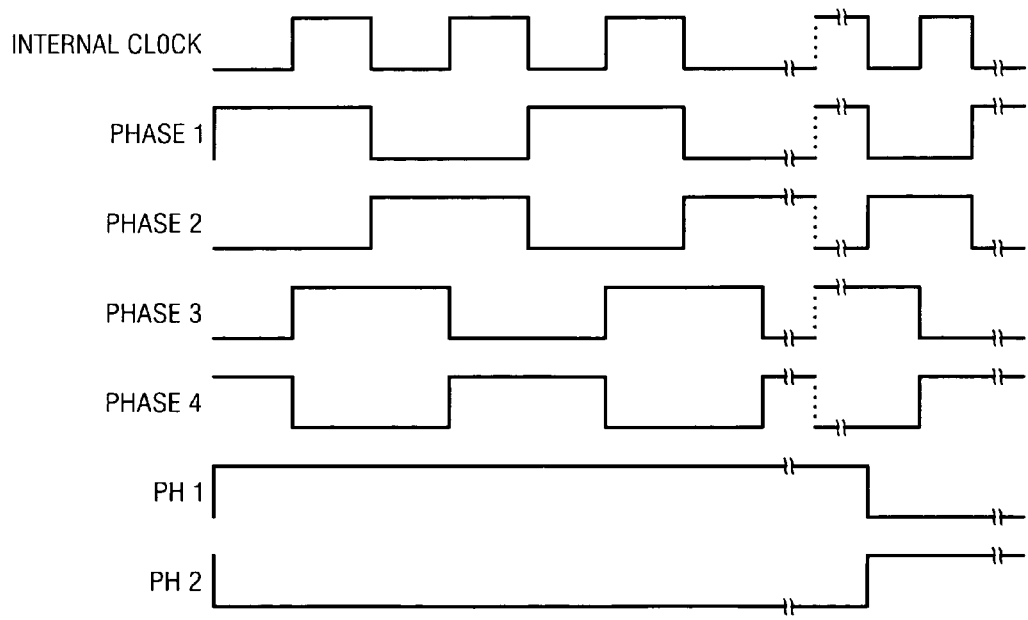
FIG. 4 is a timing diagram useful in explaining the operation of the circuit shown in FIG. 3.

Notch filter 15 includes two parallel signal paths, each with switches operating at the same frequency fs as the chopping signals shown in FIG. 4 but with a ¼ period delay. The ¼ period delays allow integrating of the amplified signal and the offset of input operational transconductance amplifier 2 in half the cycle of the chopping frequency. However, it should be noted that the switching frequency of notch filter 15 can be different than the chopping frequency fs. For example, the switching frequency of notch filter 15 can be one half of the chopping frequency fs, with no delay, in which case the amplified signal and the offset and ripple components therein are integrated over an entire chopping frequency cycle.

Notch filter output conductor 22A is connected to the (+) input of operational transconductance amplifier 3 and to one terminal of a compensation capacitor C2a, the other terminal of which is connected to output conductor 25. Notch filter output conductor 22B is connected to the (−) input of operational transconductance amplifier 3 and to one terminal of a compensation capacitor C3a, the other terminal of which is connected to ground. The output of operational transconductance amplifier 3 is connected by conductor 23 to the (−) input of transconductance operational amplifier or operational amplifier 4 (hereinafter referred to as operational amplifier 4), the output of which is connected to output conductor 25 and the (+) input of which is connected to ground. Conductor 23 also is connected to one terminal of compensation capacitor C1, the other terminal of which is connected to output conductor 25 on which the output Vout of chopper-stabilized operational amplifier 1 is generated.

The timing diagram shown in FIG. 4 illustrates four synchronized clock signals Phase1, Phase2, Phase3, and Phase4 which can be used to control the various chopping switches and filter switches as shown in FIGS. 3A and 3B. Phase1 controls chopping switches 9-1, 9-4, 10-1, and 10-4, and Phase2 controls chopping switches 9-2, 9-3, 10-2, and 10-3. Phase3 controls notch filter switches 16A, 16B, 21B, and 21D, and Phase4 controls switches 16C, 16D, 21A and 21C. In FIG. 4, the Phase3 and Phase4 notch filter clocking signals operate at the same frequency fs as the chopping signals Phase1 and Phase2 but are 90 degrees out of phase with them. (However, the Phase3 and Phase4 notch filter clocking signals could operate at half the chopping frequency, i.e. at fs/2, as the chopping signals Phase1 and Phase2 but in phase with them.) The four clock signals are referenced to or derived from an internal clock signal.

In accordance with the present invention, the timing diagram of FIG. 4 also illustrates the chopping signal PH1 which controls switches 26-1, 26-4, 30-1, and 30-4, and also illustrates chopping signal PH2 which controls switches 26-2, 26-3, 30-2, and 30-3. PH1 is a sub-harmonic of Phase1 and PH2 is a sub-harmonic of Phase2. It should be noted that there can be a very wide range between the higher main chopping frequency and the lower pre- and post-chopping frequency. The edges of the lower frequency sub-harmonic pre- and post-chopping clock signals may be either aligned with or mis-aligned with various edges of the higher frequency main chopping clock signals.

Chopper-stabilized amplifier 1-2 circuit in FIG. 3B first operates for a relatively long time during one phase of the pre- and post-chopping clock signal, and then operates for a relatively long time, with the signal path through pre-chopping circuit 26 and post-chopping circuit 30 being swapped, so mismatches result in the opposite polarity of input bias current during the next phase of the pre- and post-chopping clock signal. The signal sees the exact same thing, but the polarity of the error signal in the chopping switches due to mismatch of the capacitances are swapped.

Adding low-frequency pre-chopping switches 26 and post-chopping switches 30 which operate at a desired subharmonic frequency significantly reduces the bias current caused by mismatches in the high-frequency input chopping switches 9, but introduces new errors that are caused by pre-chopping switches 26 and post-chopping switches 30. However, these new errors are reduced because switches 26 and 30 operate at a substantially lower frequency than input chopping switches 9. The rest of the amplifier path signal path does not "see" low frequency switches 26 and 30 because they are operated synchronously with main switches 9 and there is no signal delay through the amplifier signal path.

The use of low frequency pre-chopping switches 26 ahead of high frequency input chopping switches and the use of low frequency post-chopping switches 30 after high-frequency main switches 9 and operating switches 26 and 30 at a frequency which is a sub-harmonic of the main chopping frequency reduces the input bias current without trading off ripple voltage increases that otherwise would occur is if the main chopping clock frequency is reduced. There are two reasons that this arrangement reduces input bias current. First, lowering the pre-chopping frequency for switches 26 causes a reduction of the input bias current because it is linearly proportional to the pre-chopping clock frequency. Second, the lower operating frequency of pre-chopping switches 26 allows more time for averaging the differential current (wherein one node with parasitic capacitances within the pre-chopping switches has current flowing in and another node also with parasitic capacitances has current flowing out). Such current flowing in and current flowing out have been induced by charge injection from the higher frequency input chopping switches 9. Then the error associated with the current flowing in and the current flowing out is canceled by inverting the error and then summing or integrating it over time. Furthermore, the phase of the slower chopping clock signal can be shifted with respect to the fast chopping clock to avoid interactions between clock glitches.

The embodiment of the invention shown in FIG. 3B provides a chopper-stabilized operational amplifier using a switched capacitor notch filter with synchronous integration in a continuous time signal path to reduce chopping noise to a level well below the total rms noise of the operational amplifier, wherein low-frequency pre-chopping switches 26 and post-chopping switches 30 provide substantially reduced input bias current without requiring reduction of the frequency of main input chopping switches 9. The chopper-stabilized operational amplifier nevertheless maintains the benefits of chopper stabilization while attenuating the ripple voltage at the chopping frequency fs. The invention thereby provides a chopper-stabilized operational amplifier having substantially reduced output ripple voltage compared to conventional chopper-stabilized amplifiers. This is achieved with no increase in quiescent amplifier current Iq due to the notch filter. The invention is particularly advantageous in micropower integrated circuit applications and/or low noise applications. The above described technique was evaluated by means of a test wafer wherein the ratio of the Phase1 clock signal to the sub-harmonic PH1 clock signal was 1 to 16. This resulted in a reduction of the input bias current by a factor of approximately 4.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A chopper-stabilized circuit comprising:
 (a) a signal conditioning circuit;
 (b) pre-chopping circuitry for pre-chopping an input signal at a first chopping frequency to produce a first chopped signal;
 (c) first chopping circuitry for chopping the first chopped signal at a second chopping frequency greater than the first chopping frequency to produce a second chopped signal; and
 (d) post-chopping circuitry for chopping the second chopped signal at the first chopping frequency to produce a third chopped signal and applying the third chopped signal to an input of the signal conditioning circuit.

2. The chopper-stabilized circuit of claim 1 including second chopping circuitry coupled to an output of the signal conditioning circuit for chopping an output signal produced by the signal conditioning circuit at the second chopping frequency to generate a fourth chopped signal, wherein the signal conditioning circuit includes a first operational transconductance amplifier, and wherein the first chopping frequency is a sub-harmonic of the second chopping frequency.

3. The chopper-stabilized circuit of claim 2 wherein the first chopping frequency is $\frac{1}{16}$ of the second chopping frequency.

4. The chopper-stabilized circuit of claim 2 including filter circuitry coupled to filter the fourth chopped signal to generate a filtered output signal.

5. The chopper-stabilized circuit of claim 4 wherein the filter circuitry includes a switched capacitor notch filter having an input coupled to receive the fourth chopped signal, wherein the switched capacitor notch filter operates to perform an integrate and transfer function on the fourth chopped signal to filter it by operating synchronously with the chopping by the second chopping circuitry to notch filter ripple voltages that otherwise would occur in the fourth chopped signal.

6. The chopper-stabilized circuit of claim 5 wherein switching of the switched capacitor notch filter is 90 degrees out of phase with the chopping of the fourth chopped signal.

7. The chopper-stabilized circuit of claim 5 including a second operational transconductance amplifier having an input coupled to an output of the notch filter.

8. The chopper-stabilized circuit of claim 5 wherein the input of the notch filter includes first and second input terminals, wherein the notch filter includes first and second output terminals, and wherein the notch filter includes
 i) a first path including a first switch coupled between the first input terminal and a first conductor, a second switch coupled between the first conductor and the first output terminal, a third switch coupled between the second input terminal and a second conductor, and a fourth switch coupled between the second conductor and the second output terminal,
 ii) a second path including a fifth switch coupled between the first input terminal and a third conductor, a sixth switch coupled between the third conductor and the first output terminal, a seventh switch coupled between the second input terminal and a fourth conductor, and an eighth switch coupled between the fourth conductor and the second output terminal, and iii) a first integrate and transfer capacitor coupled between the first and second conductors and a second integrate and transfer capacitor coupled between the third and fourth conductors.

9. The chopper-stabilized circuit of claim 8 wherein the first, third, sixth and eighth switches are controlled by a first clock signal and the second, fourth, fifth, and seventh switches are controlled by a second clock signal, wherein the first and second clock signals are out of phase with each other.

10. The chopper-stabilized circuit of claim 9 wherein transitions of the first and second clock signals are shifted with respect to transitions of a chopping signal of the second chopping circuitry.

11. The chopper-stabilized circuit of claim 10 wherein transitions of the first and second clock signals are shifted by 90 degrees with respect to transitions of a chopping signal of the second chopping circuitry.

12. The chopper-stabilized circuit of claim 5 wherein the notch filter operates synchronously with a chopping signal of the second chopping circuitry to cause a charge at the input of the notch filter to be integrated onto a first integrate and transfer capacitor during the first clock signal and onto the second integrate and transfer capacitor during the second clock signal and to cause the charge held on the first integrate and transfer capacitor to be transferred to the output of the notch filter during the second clock signal and to cause the charge held on the second integrate and transfer capacitor to be transferred to the output of the notch filter during the first clock signal.

13. The chopper-stabilized circuit of claim 5 wherein the notch filter operates at the same or lower frequency than the second chopping frequency.

14. The chopper-stabilized circuit of claim 7 including a third operational transconductance amplifier having an input coupled to an output of the second operational transconductance amplifier, and a fourth operational transconductance amplifier having an input coupled to receive the input signal and an output coupled to the output of the second operational transconductance amplifier.

15. The chopper-stabilized circuit of claim 13 including compensation capacitance coupled on the input side of the notch filter and the output side of the notch filter.

16. The chopper-stabilized circuit of claim 15 wherein the amount of compensation capacitance coupled on the input side of the notch filter is substantially greater than the amount of compensation capacitance coupled on the output side of the notch filter to provide stability and fast signal settling in the chopper-stabilized amplifier.

17. A method of operating a chopper-stabilized circuit including a signal conditioning circuit so as to reduce ripple noise without substantially increasing input bias current, the method comprising:

(a) chopping an input signal at a first chopping frequency to generate a first chopped signal;
(b) chopping the first chopped signal at a second chopping frequency substantially greater than the first chopping frequency to produce a second chopped signal;
(c) chopping the second chopped signal at the first chopping frequency to produce a third chopped signal and applying the third chopped signal to an input of the signal conditioning circuit; and
(d) chopping an output signal of the signal conditioning circuit at the second chopping frequency to generate a fourth chopped signal.

18. The method of claim 17 wherein the signal conditioning at the first chopping frequency is a sub-harmonic of the second chopping frequency, the method including filtering the fourth chopped signal to generate a filtered output signal.

19. The method of claim 18 including filtering the fourth chopped signal by means of a switched capacitor notch filter having an input coupled to receive the fourth chopped signal, the method also including operating the switched capacitor notch filter by performing an integrate and transfer function on the fourth chopped signal synchronously with the fourth chopped signal to notch filter ripple voltages from the fourth chopped signal.

20. A chopper-stabilized circuit comprising:

(a) a signal conditioning circuit;
(b) means for chopping an input signal at a first chopping frequency to generate a first chopped signal;
(c) means for chopping the first chopped signal at a second chopping frequency substantially greater than the first chopping frequency to produce a second chopped signal;
(d) means for chopping the second chopped signal at the first chopping frequency to produce a third chopped signal and applying the third chopped signal to an input of the signal conditioning circuit; and
(e) means for chopping an output signal produced by the signal conditioning circuit at the second chopping frequency to generate a fourth chopped signal.

* * * * *